United States Patent
Verma et al.

(10) Patent No.: US 12,069,936 B2
(45) Date of Patent: Aug. 20, 2024

(54) ELECTRONIC DEVICE AND METHOD FOR SLOT-DIE DEPOSITING LAYERS OF THE SAME

(71) Applicants: EMPA EIDGENÖSSISCHE MATERIALPRÜFUNGS-UND FORSCHUNGSANSTALT, Dubendorf (CH); SOLARONIX S.A., Aubonne (CH)

(72) Inventors: Anand Verma, Bihar (IN); David Martineau, Etoy (CH); Frank Nüesch, Wangen (CH); Jacob Heier, Zürich (CH); Tobias Meyer, Féchy (CH)

(73) Assignees: EMPA EIDGENÖSSISCHE MATERIALPRÜFUNGS-UND FORSCHUNGSANSTALT, Dubendorf (CH); SOLARONIX S.A., Aubonne (CH)

( * ) Notice: Subject to any disclaimer, the term of this patent is extended or adjusted under 35 U.S.C. 154(b) by 305 days.

(21) Appl. No.: 17/056,331

(22) PCT Filed: May 17, 2019

(86) PCT No.: PCT/EP2019/062888
§ 371 (c)(1),
(2) Date: Nov. 17, 2020

(87) PCT Pub. No.: WO2019/219952
PCT Pub. Date: Nov. 21, 2019

(65) Prior Publication Data
US 2021/0210685 A1    Jul. 8, 2021

(30) Foreign Application Priority Data

May 17, 2018 (EP) ..................... 18173055
Jun. 27, 2018 (EP) ..................... 18180245

(51) Int. Cl.
*H10K 71/15* (2023.01)
*H10K 30/00* (2023.01)
(Continued)

(52) U.S. Cl.
CPC ............. *H10K 71/15* (2023.02); *H10K 30/35* (2023.02); *H10K 30/451* (2023.02); *H10K 71/135* (2023.02)

(58) Field of Classification Search
CPC ............. H01L 51/0007; H01L 51/0005; H01L 51/4206; H01L 51/426
See application file for complete search history.

(56) References Cited

U.S. PATENT DOCUMENTS

2002/0012846 A1* 1/2002 Skotheim ............ H01M 50/46
                                                          429/231.95
2009/0233800 A1* 9/2009 Huang ............... H10N 60/0716
                                                          427/63
2016/0268510 A1* 9/2016 Moon ..................... C07F 7/22

FOREIGN PATENT DOCUMENTS

CN       203871350 U     10/2014
CN       104124291 B      8/2016
(Continued)

OTHER PUBLICATIONS

"Dyesol Catalogue", Dyesol, [online], [retrieved on Nov. 18, 2022]. Retrieved from the Internet:<URL: http://3d-nano.com/wp-content/uploads/2016/09/2013-Dyesol-Catalogue-005.22042013.pdf> (Year: 2013).*

(Continued)

Primary Examiner — Tae-Sik Kang
(74) Attorney, Agent, or Firm — E. Eric Mills; Nicholas P. Stadnyk; Maynard Nexsen PC

(57) ABSTRACT

The present invention concerns a method for deposition layers of an electronic device by slot-die deposition. Preferably, the method comprises slot-die deposition of formu- (Continued)

lation for providing compact inorganic layers, mesoporous inorganic layers, a carbon layer and a layer comprising organic-inorganic perovskite. In a preferred embodiment, the layers of a monolithic perovskite solar cell are entirely deposited by slot-die deposition. The method renders the manufacturing process of such electronic devices more efficient.

16 Claims, 2 Drawing Sheets

(51) Int. Cl.
H10K 30/35 (2023.01)
H10K 71/13 (2023.01)

(56) References Cited

FOREIGN PATENT DOCUMENTS

| | | | |
|---|---|---|---|
| WO | 2015184197 A2 | 12/2015 | |
| WO | WO-2016202424 A1 * | 12/2016 | ............ C08G 61/123 |

OTHER PUBLICATIONS

Wood et al., "Advanced Materials Processing and Novel Characterization Methods for Low-Cost, High Energy-Density Lithium-Ion Batteries", Advanced Automotive Battery Conference 2013, Conference Paper · Jan. 2013, pp. 1-17. (Year: 2013).*
Gibert et al., "Cycling Behavior of NCM523/Graphite Lithium-Ion Cells in the 3-4.4 V Range: Diagnostic Studies of Full Cells and Harvested Electrodes", Journal of The Electrochemical Society, 164 (1) A6054-A6065 (2017) (Year: 2017).*
Jansen et al., "Fabricate PHEV Cells for Testing & Diagnostics", Vehicle Technologies Program Annual Merit Review and Peer Evaluation Meeting, Washington, D.C. May 9-13, 2011, pp. 1-22 (Year: 2011).*
International Search Report and Written Opinion issued in counterpart PCT Application No. PCT/EP2019/062888 dated Sep. 25, 2019 (fourteen (14) pages).
Burkitt, Daniel et al. 2018. "Perovskite solar cells in N-I-P structure with four slot-die-coated layers." Royal Society Open Science. vol. 5, No. 5, pp. 172158-2-172158-3.
Jung Yen-Sook et al. 2017. "One-Step Printable Perovskite Films Fabricated under Ambient Conditions for Efficient and Reproducible Solar Cells." ACS Applied Materials & Interfaces. vol. 9, No. 33, pp. 27832-27838.
Priyadarshi, Anish et al. 2016. "A large area (70 cm 2 ) monolithic perovskite solar module with a high efficiency and stability." Energy & Environmental Science. vol. 9, No. 12, pp. 3687-3692.
European Search Report issued in counterpart EP Application No. 18180245 dated Apr. 3, 2019 (four (4) pages).
Qin, Tinshi et al. 2017. "Amorphous hole-transporting layer in slot-die coated perovskite solar cells." Nano Energy, vol. 31, pp. 210-217.
Remeika, Mikas et al. 2018. "High-throughput surface preparation for flexible slot die coated perovskite solar cells." Organic Electronics, vol. 54, pp. 72-79.
Ciro, John et al. 2017. "Slot-die processing of flexible perovskite solar cells in ambient conditions." Solar Energy, vol. 150, pp. 570-576.

* cited by examiner

ELECTRONIC DEVICE AND METHOD FOR SLOT-DIE DEPOSITING LAYERS OF THE SAME

CROSS REFERENCE TO RELATED APPLICATIONS

This application is a 35 U.S.C. § 371 U.S. national phase entry of International Application No. PCT/EP2019/062888 having an international filing date of May 17, 2019, which claims the benefit of European Application No. 18173055.7, filed May 17, 2018, and which claims the benefit of European Application No. 18180245.5, filed Jun. 27, 2018, the entire disclosures of which are incorporated herein by reference in their entirety.

TECHNICAL FIELD

The present invention relates to electronic devices, methods for producing the devices and for producing layers of such devices. In particular, the invention relates to novel methods for depositing, by slot-die deposition, formulations providing layers of such devices. The invention also relates to novel formulations for depositing the layers. Preferably, the devices are optoelectronic devices.

BACKGROUND ART AND PROBLEMS SOLVED BY THE INVENTION

Among the group of sensitized and heterojunction photovoltaic solar cells, the perovskite solar cells have exhibited greatest attention in the past few years and have reached certified power conversion efficiencies of above 22%. These types of solar cells are interesting basically due to the comparatively low costs of the starting materials compared to silicon based solar cells. Consequently, there have been efforts to develop industrial scale processes for the fabrication of such solar cells. The development of cost efficient and scalable processes for producing such cells is key to their wider dispersal and their use in more applications.

An obstacle to the industrial scale production of sensitized and heterojunction solar cells lies in the fact that the processes used in the lab for producing such cells are not easily or not at all scalable. Furthermore, the currently used processes are not ideal in terms of cost efficiency. The semiconductor layers used, for example, in a perovskite or dye-sensitized solar cells are subjected to sintering after the deposition of each layer. In addition, certain deposition techniques frequently used for deposition one or several layers of the solar cell, such as spin coating, cannot be used on an industrial scale.

There have been efforts to produce sensitized and heterojunction solar cells by printing techniques. For example, Syed Ghufran Hashmi et al, Advanced Materials Technologies, 2 (1) 2017 discloses the efficient deposition of a perovskite layer by inkjet printing. CN203871350 mentions the possibility of inkjet printing several layers of a perovskite solar cell.

M. Remeika et al., Organic Electronics 54 (2018)72-79 discloses the high-throughput preparation of flexible coated perovskite solar cells in a different architecture, where slot-die coating was used in cooperation with evaporation to complete the device.

T. Qin, Nano Energy 31 (2017) 2010-217 discloses an amorphous hole transporting layer in slot-die coated perovskite solar cells.

It is an objective of the invention to provide an efficient method for producing optoelectronic devices, in particular sensitized, perovskite and heterojunction solar cells.

It is an objective of the invention to provide an efficient method for producing layers of electronic devices, in particular layers of optoelectronic devices such as sensitized, perovskite and heterojunction solar cells. It is an objective to provide methods for producing devices comprising inorganic layers, including one or more compact and mesoporous inorganic layers.

It is an objective of the invention to render the manufacturing of electronic devices more efficient in particular in terms of manufacturing time, costs, and energy expenditure.

It is an objective of the invention to provide manufacturing and/or deposition methods that can be scaled up, preferably to industrial manufacturing. It is also an objective of the invention to provide methods that allow the production of larger area electronic devices and parts thereof, compared to lab-scale devices.

The present invention addresses the problems depicted above.

SUMMARY OF THE INVENTION

Remarkably, the present inventors produced an electronic device by slot-die depositing one or more layers of the device, including different metal oxide layers, a porous carbon layer, and including compact and porous semiconductor layers. Slot-die deposition of such layers was previously not reported. Remarkably, the method of the invention enables large-scale production of efficient solar cells.

In an aspect, the present invention provides a method for depositing one or more layers of an electronic device by slot-die coating.

In an aspect, the present invention provides a method for slot-die depositing a formulation in the production of layers of an electronic device.

In an aspect, the present invention provides a method for producing layers of an electronic device by depositing one or more layers by slot-die deposition.

In an aspect, the present invention provides a method for producing an electronic device.

In an aspect, the invention provides a method for depositing one or more layers of an electronic device, the method comprising depositing one or more formulation by slot-die deposition, wherein said formulation comprises: one or more selected from the group consisting of: organic constituents, inorganic constituents, metal-organic precursors of said inorganic constituents, and carbon; and, a carrier composition comprising one or more solvents. Said constituents are preferably constituents of the layer of the electronic device.

In an aspect, the present invention provides formulations for slot-die depositing layers of an electronic device.

The invention provides one or more layers produced and/or deposited in accordance with the method of the invention and electronic devices produced in accordance with the method of the invention.

In an aspect, the invention provides an electronic device comprising the layers obtained according to the method of the invention.

In an aspect, the invention provides the use of components, such as fluorosurfactants, in formulations for slot-die-depositing layers of an electronic device.

In an aspect, the invention provides formulations for slot-die depositing layers of an electronic device. Such formulations include one or more selected from a formulation for depositing a compact metal oxide layer, a formulation for depositing a mesoporous metal oxide layer, for example a metal oxide insulating and/or semiconductor layer, and a formulation for depositing a carbon layer, preferably a porous carbon layer. Aspects of the invention directed to such formulations are provided in the appended claims.

Preferred electronic devices are optoelectronic devices, such as solar cells. However, the present invention may be applied to other types of electronic devices, which are not optoelectronic or not necessarily optoelectronic.

Further aspects and preferred embodiments of the invention are provided in the appended claims and in the description of preferred embodiments herein below.

Figure 1:
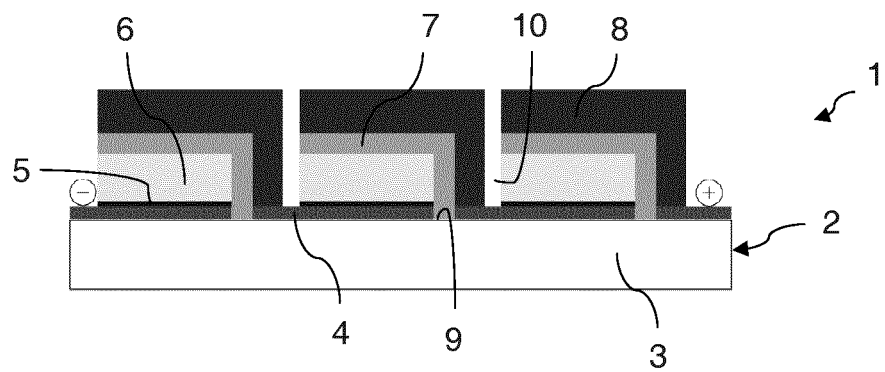
FIGS. 1A and 1A schematically show the architectures of solar cells produced in accordance with embodiments of the present invention.
Figure 1:
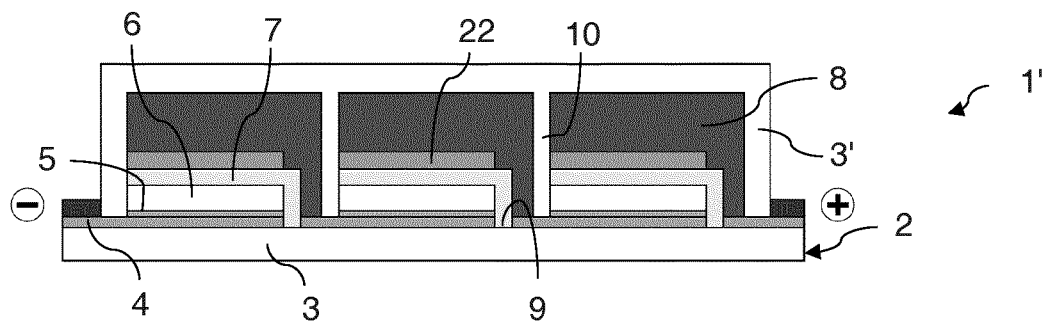

Hereinafter, preferred aspects and embodiments of the device of the invention are described, in order to illustrate the invention, without any intention to limit the scope of the present invention.

DETAILED DESCRIPTION OF THE PREFERRED EMBODIMENTS

In some embodiments and aspects, the invention provides methods for depositing one or more layers of an electronic device, preferably an optoelectronic device. Preferably, one or more of said layers are deposited by slot-die coating.

The layers are preferably deposited by the slot-die deposition of formulations comprising the constituents of the layers and/or precursors of such constituents. The constituents or precursors are preferably suspended and/or dissolved in a carrier composition comprising one or more solvents and optionally additives, preferably organic additives, such as organic binders.

For the purpose of the present specification, the term "formulation", "ink", "ink formulation", "ink composition" may be used interchangeably. They refer to the formulation that is preferably deposited by slot-die coating in accordance with the invention. The formulation may be considered as a composition of matter. Preferably, the formulation is a suspension of solid particles in a carrier composition comprising one or more solvents or a solution. The formulation may comprise suspended and/or dissolved components.

In an embodiment, the electronic or optoelectronic device is selected from solar cells, photodetectors, light emitting diodes (LEDs), such as perovskite light emitting diodes (PLEDs), transistors and detector. In an embodiment, the device comprises a heterojunction, for example is a heterojunction solar cell. In a preferred embodiment, the optoelectronic device is a solar cell, preferably selected form a perovskite and a dye-sensitized solar cell. In an embodiment, said optoelectronic device is a solid-state solar cell.

In preferred embodiments, said solar cell is substantially free of organic compounds other than those of the organic organic-inorganic perovskite, dye or sensitizer. Preferably, the electronic device is free of an organic hole transport layer (HTL). For example, the device is substantially free of a layer comprising or consisting essentially of poly (3,4-ethylenedioxythi-ophene):poly(styrene-sulfonate) (PEDOT:PSS) HTL. In an embodiment, the device is substantially free of a layer comprising or consisting essentially of an organic n-type semiconductor material layer. For example, the device is substantially free of a layer comprising or consisting essentially of [6,6]-phenyl-$C_{61}$-butyric acid methyl ester (PCBM). In an embodiment, the device is not an organic solar cell, preferably not an organic perovskite solar cell. In an embodiment, the semiconductor and/or hole transport layer of the device of the invention comprise inorganic layers or comprise carbon. For example, the device comprises metal oxide semiconductor layer, preferably a compact and/or mesoporous metal oxide semiconductor layer.

Slot-die coaters or printers are commercially available. The deposition is made via a printer head, which generally deposits a formulation at a determined rate by moving relative to a substrate, or the substrate moving relative to the head. Preferably, the head of the slot-die printer is not in direct contact with the substrate on which the formulation is deposited, such that the movement of the ink is assisted by gravity and possibly pressure exerted when the ink moves through the opening in the printer head. Slot-die coaters may work within a broad range of viscosities, for example between less than 1 mPa·s and several thousand Pa·s while the coating speed has a similar wide spectrum between less than 1 m/min and more than 600 m/min. Slot-die coating generally belongs to the pre-metered coating processes, whereby all of the supplied formulation is deposited on the substrate. The wet layer thickness is generally controlled by the flow rate, coating width, and speed.

The slot-die coating head generally comprises two head components, which may be made from stainless steel, for example, and which generally define an ink distribution chamber, feed slot, and an up- and downstream lip. An internal shim foil (mask) provided between the two head components generally defines the feed slot width and allows stripe or curtain coating. The shim foil thickness generally depends on the viscosity of the ink formulation and is typically in the range of 25-50 µm for low-viscous inks <20 mPa·s. Furthermore, stripe coating at slow speed may be supported by a second internal mask with small protrusions (meniscus guide) at the coating lip that prevent the joining of the menisci between two adjacent stripes.

For the purpose of the present invention, the term "comprising" and its various grammatical forms is intended to mean "includes, amongst other". It is not intended to mean "consists only of".

Layers of electronic devices are generally provided by deposition on a substrate. In an embodiment, the substrate is part of the electronic device to be produced. In other embodiments, the substrate is provided for the purpose of depositing layers in accordance with the invention, but the substrate may not be used in the final electronic device. The latter embodiment may imply that the plurality of layers may be removed from the substrate after they have been produced.

In some embodiments, the method of the invention comprises providing a substrate for depositing layers of an electronic device.

In an embodiment, the substrate is conductive. For example, the substrate itself comprises already a layer that imparts conductivity to the substrate. Preferably, the conductive layer comprises a transparent conductive oxide (TCO), such as indium doped tin oxide (ITO), fluorine doped tin oxide (FTO), ZnO—$Ga_2O_3$, ZnO—$Al_2O_3$, tin oxide, antimony doped tin oxide (ATO), $SrGeO_3$ and zinc oxide. These materials may be coated on a substrate, such as transparent plastic or glass. For the purpose of the present specification, the conductive layer, such as the TCO layer provided on the conductive substrate is preferably not encompassed in the layers of the device deposited by slot-die coating. In accordance with the invention, the conductive substrate may be commercially obtained and the invention is not limited with respect to the manner that the TCO layer is deposited on the substrate.

The conductive substrate may operate as the front or as the back contact of the electronic device, depending on the device architecture. In some embodiments, the substrate is transparent. The substrate may be selected from conductive glass or conductive plastic. The substrate may be flexible.

In other embodiments, the substrate is not transparent. Transparency of the substrate is preferred in the case of devices where the side of the substrate is exposed to the electromagnetic radiation that is to be transformed to electricity in the case of a solar cell, but also in the case of optoelectronic devices which are intended to emit light through the substrate, in case of LEDs, for example.

In an embodiment, the methods of the invention comprise depositing one or more layers of an electronic device, the method comprising depositing one or more formulation by slot-die deposition, wherein said formulation comprises:
  one or more selected from the group consisting of: organic constituents, inorganic constituents, metal-organic precursors of said inorganic constituents, and carbon;
  a carrier composition comprising one or more solvents.

In an embodiment, the methods of the invention comprise depositing, by slot-die deposition, one or more of formulations for providing:
  a compact layer comprising a metal oxide semiconductor material,
  a mesoporous layer comprising a mesoporous metal oxide semiconductor material,
  a mesoporous layer comprising a metal oxide insulating material, and, optionally,
  a porous layer, preferably a mesoporous layer, comprising one or more carbon materials.

In an embodiment, the formulation comprises inorganic constituents of layers of the electronic device. Such inorganic constituents may be selected, for example, from inorganic semiconductor materials and inorganic insulating materials. Preferably, the inorganic constituents are selected from metal oxides, preferably from metal oxide semiconductor materials and metal oxide insulating materials.

In some embodiments, the constituents and in particular inorganic constituents may be present in the form of particles, preferably micro and/or nanoparticles. In an embodiment, said formulation comprises nanoparticles of a metal oxide material and/or the device comprises a mesoporous layer comprising one or more metal oxide materials.

For the purpose of the present specification, the term "nanoparticles" encompasses particles or particulate elements, which may have any form, in particular also so-called nanosheets, nanocolumns and/or nanotubes, for example.

Semiconductor materials may be selected from n- and p-type semiconductors. In an embodiment, the semiconductor material is an n-type semiconductor material. Preferably, the semiconductor material is an inorganic material, more preferably a metal oxide semiconductor.

Semiconductor materials may be selected from the group consisting of Si, $SiO_2$, $TiO_2$, $Al_2O_3$, $ZrO_2$, $HfO_2$, $SnO_2$, $Fe_2O_3$, ZnO, $WO_3$, $Nb_2O_5$, $In_2O_3$, $Bi_2O_3$, $Y_2O_3$, $Pr_2O_3$, $CeO_2$ and other rare earth metal oxides, CdS, ZnS, PbS, $Bi_2S_3$, CdSe, CdTe, $MgTiO_3$, $SrTiO_3$, $BaTiO_3$, $Al_2TiO_5$, $Bi_4Ti_3O_{12}$ and other titanates, $CaSnO_3$, $SrSnO_3$, $BaSnO_3$, $Bi_2Sn_3O_9$, $Zn_2SnO_4$, $ZnSnO_3$ and other stannates, $CaZrO_3$, $SrZrO_3$, $BaZrO_3$, $Bi_4Zr_3O_{12}$ and other zirconates, combinations of two or more of the aforementioned and other multi-element oxides containing at least two of alkaline metal, alkaline earth metal elements, Al, Ga, In, Si, Ge, Sn, Pb, Sb, Bi, Sc, Y, La or any other lanthanide, Ti, Zr, Hf, Nb, Ta, Mo, W, Ni or Cu.

Si, $Fe_2O_3$, CdS, PbS, $Bi_2S_3$, CdSe, CdTe, are colored semiconductors and are less preferred in accordance with embodiments of the present invention. $WO_3$, $Bi_2O_3$, are yellowish. In accordance with the invention, colourless to slightly yellow materials with a band gap of greater than 2.7 eV are preferred. Colourless materials with a band gap of greater than 3 eV are more preferred, $TiO_2$ is most preferred.

In an embodiment, the semiconductor material is an p-type semiconductor material. An exemplary p-type semiconductor material is NiOx, with x being between 0.5 and 2, preferably between 1 and 2. In NiOx, the O is generally not stoichiometrically present.

In an embodiment, said formulation comprises nanoparticles of a metal oxide semiconductor material and/or the device comprises a mesoporous layer comprising a metal oxide semiconductor material.

In an embodiment, the inorganic material is an inorganic semiconductor material, preferably a metal oxide semiconductor material. For providing a mesoporous layer comprising a metal oxide semiconductor material, a formulation comprising nanoparticles of a metal oxide semiconductor material may be deposited in accordance with the method of the invention. For providing a compact layer comprising a metal oxide semiconductor material, a formulation comprising a precursor of the semiconductor material and/or comprising nanoparticles of the semiconductor material may be deposited.

In an embodiment, the inorganic material is an inorganic insulating material, preferably a metal oxide insulating material.

Insulating materials may be selected from insulating metal oxides, such as $ZrO_2$, $Al_2O_3$, $SiO_2$, for example. $ZrO_2$ is a preferred insulating material. Instead of an insulating material, a wide band gap semiconductor material may be used, where wide band gap refers to a band gap of 2-4 eV. An insulator would have a band gap of above 4 eV, for example.

In an embodiment, said formulation comprises nanoparticles of a metal oxide insulating material and/or the device comprises a mesoporous layer comprising a metal oxide insulating material.

For providing a mesoporous layer comprising a metal oxide insulating material, a formulation comprising nanoparticles of the metal oxide insulating material may be deposited in accordance with the method of the invention. For providing a compact layer comprising a metal oxide insulating material, a formulation comprising a precursor of the insulating material and/or comprising nanoparticles of the insulating material may be deposited.

In an embodiment, the formulation comprises one or more precursors of inorganic constituents of a layer of the electronic device, preferably optoelectronic device. A precursor is preferably selected from precursors of the inorganic materials disclosed herein above, in particular of the inorganic semiconductor and insulating metal oxide materials disclosed in this specification, for example.

In an embodiment, said precursor of said inorganic constituent comprises a metal-organic precursor of an inorganic material. Said metal-organic precursor is preferably a metal alkoxide.

Preferably, the metal-organic compound comprises one or more metal cations and one or more organic oxides, such as an alkoxide. Said precursor is preferably useful for a sol-gel production of the inorganic constituent of the electronic device. The metal of said metal alkoxide is preferably selected from the metals as present in the inorganic semiconductor and/or insulating materials disclosed elsewhere in this specification, such as Ti, Al, Zr, Hf, Sn, Fe, Zn, W, Nb, In, Pr, Ce, Y, Zn, including alkaline metals, alkaline earth metals and any other lanthanide, for example. In an embodiment, said metal-organic precursor comprises two or more different metals.

The metal-organic compound may be a precursor of a semiconductor or of an insulating material, preferably a metal oxide semiconductor material. An exemplary precursor of an inorganic material is titanium diisopropoxide bis(acetylacetonate). This compound may be present in formulations intended to form a compact $TiO_2$ layer. The inorganic layer is formed, for example, by drying and/or firing of the layer comprising the organic titanate.

For providing a compact layer comprising a compact metal oxide material, for example a compact semiconductor or a compact insulating layer, a formulation comprising a metal-organic oxide precursor material may be deposited in accordance with the method of the invention. As mentioned above, compact layers may also be provided by depositing formulations comprising nanoparticles of the inorganic material.

If a compact layer comprising an inorganic semiconductor material is deposited, the semiconductor may be an n-type or p-type semiconductor layer.

In an embodiment, the formulation comprises carbon and/or a carbon material. For the purpose of the present specification, "carbon" and "a carbon material" comprises carbon black and/or graphite or both.

In an embodiment, said formulation comprises nano- and/or micro particles of a carbon material and/or the device comprises a porous carbon layer, preferably a mesoporous carbon layer.

For providing a porous layer, preferably a micro and/or mesoporous layer comprising a carbon material, a formulation comprising carbon nano- and/or micro-particles is preferably deposited in accordance with the method of the invention. Preferably, the formulation comprises carbon-black nanoparticles and/or graphite microparticles.

In an embodiment, the formulation deposited by slot-die coating preferably comprises one or more organic materials, preferably in addition to inorganic materials, precursors of the latter and/or carbon. The organic materials preferably comprise one or more solvents and, optionally, additives, such as binders and/or surfactants, wherein said surfactant may be organic or inorganic.

In an embodiment, the formulation comprises a carrier composition comprising one or more solvents. Accordingly, the formulation comprises said one or more solvents. In an embodiment, the carrier composition comprises a solvent mixture comprising two or more solvents.

For the purpose of the present specification, the terms "solvent" and "solvents" should not be interpreted to mean that all constituents of the formulation are necessarily dissolved in said solvent. As specified elsewhere, the formulation may comprise nanoparticles, which are typically suspended in said solvents and more generally in said carrier formulation. In other embodiments, one or more constituents of the formulation may indeed be dissolved, such as, for example, said organic titanate, or other metal organic compounds.

In an embodiment, the carrier composition comprises a solvent mixture comprising one or more low boiling point solvents and one or more high boiling point solvents, preferably one or more low boiling point solvents and one high boiling point solvent. Preferably, said one or more low boiling point solvent has a boiling point of <200° C. and said one or more high boiling point solvent has a boiling point of ≥200° C.

In an embodiment, said one or more low boiling point solvents are selected from non-terpene alcohols, preferably from C1-C8 alkyl alcohols (C1-C8 alcanols), more preferably C1-C5 alkyl alcohols. In a preferred embodiment, said C1-C8 and/or C1-C5 alkyl alcohols are selected from methanol, ethanol, propanol, for example isopropanol, and butanol, more preferably from ethanol and propanol, preferably isopropanol.

In an embodiment, said one or more high boiling point solvents are selected from the group consisting of: aromatic solvents, non-aromatic solvents, protic solvents, aprotic solvents, aprotic and aromatic solvents, preferably tetralin, and protic non-aromatic solvents, preferably terpene alcohol, more preferably a monoterpene alcohol.

In an embodiment, said high boiling point solvent is selected from decalin, dialin, naphthalin and terpene alcohols, preferably monoterpene alcohols.

In an embodiment, the carrier composition comprises one or more binders. The binder are preferably present in addition to said one or more solvents.

Binders are preferably present in formulations comprising nanoparticles, precursors of inorganic materials and/or in formulations comprising carbon micro- and/or nanoparticles. The purpose of the binders is to provide a homogenous formulation, assist in suspending the nanoparticles and provide proper spacing between nanoparticles during and after deposition and before firing. An exemplary binder is cellulose or a derivative thereof, or another organic polymer, in particular polysaccharide and/or derivative thereof. Preferably, the binder comprises a polysaccharide and/or derivative thereof, and/or polysaccharides and derivatives thereof. Preferably, the binder is soluble in said solvents or solvent mixture. Therefore, the binder may preferably be selected depending on the solvents and/or solvent mixture.

In an embodiment, the formulation comprises constituents for depositing a compact layer comprising an inorganic material, preferably a metal oxide semiconductor material, most preferably a compact $TiO_2$ layer. In an embodiment, the formulation comprises a metal-organic precursor of said inorganic constituent, more preferably a metal alkoxide precursor. In an embodiment, said precursor is organic titanate. In an embodiment, said formulation comprises a carrier composition comprising a surfactant, preferably a fluorosurfactant. In an embodiment, formulation comprises a carrier composition comprising a solvent mixture comprising one, two or more different low boiling point solvents and a high boiling point solvent. Preferably, the formulation comprises one or more different non-terpene alcohol solvents, preferably one or more different C1-C8 alkyl alcohol solvents and/or wherein said high boiling point solvent is an aprotic and/or aromatic solvent, preferably tetralin.

In a preferred embodiment, the formulation for depositing a compact layer comprising an inorganic material, preferably a metal oxide semiconductor material, preferably a compact $TiO_2$ layer, comprises a metal-organic precursor of said inorganic constituent, a surfactant, and a solvent mixture comprising 10-60 vol % of a high boiling point solvent and 10-60 vol % of one or more C1-C5 alkyl alcohol solvent, preferably isopropanol and/or ethanol. Preferably, said high boiling point solvent is selected from aprotic and/or aromatic solvents, preferably tetralin.

In a more preferred embodiment, the formulation for depositing a compact layer comprising said metal organic precursor comprises tetralin and one or both selected from isopropanol, and ethanol. Preferably said metal-organic precursor is a metal alkoxide. Preferably, said solvent mixture comprises 10-70 vol % tetralin, 10-60 vol % isopropanol, and 10-50 vol % ethanol. More preferably, said solvent mixture comprises 20-60 vol % tetralin, 20-50 vol % isopropanol, and 20-40 vol % ethanol. Preferably said precursor is titanium diisopropoxide bis(acetylacetonate).

The invention provides further formulations suitable for depositing a compact layer comprising an inorganic material, for example a metal oxide semiconductor material.

In an embodiment, the formulation for depositing a compact layer comprising a metal oxide material comprises a metal-organic precursor of said metal oxide material and a solvent mixture comprising two or more different alcohols selected from C1-C8 alkyl alcohols, preferably isopropanol and ethanol. Preferably, said metal oxide is a semiconductor material. In accordance with this embodiment, a surfactant is preferably absent. Preferably, the solvent mixture comprises 0.1-40 vol % isopropanol and 50-99.1 vol % ethanol, more preferably 1-30 vol % isopropanol and 70-90 vol % ethanol, more preferably 2-20 vol % isopropanol and 80-97 vol % ethanol. Preferably, said metal-organic precursor is an organo-metal oxide compound, preferably organic titanate, most preferably titanium diisopropoxide bis(acetylacetonate).

In yet another embodiment, the formulation for depositing a compact layer comprising a metal oxide material comprises a metal-organic precursor of said inorganic material and a solvent mixture comprising two or more C1-C5 alkyl alcohols, preferably isopropanol and ethanol, and, in addition, a non-ionic surfactant, such as a fluorosurfactant. Preferably, said metal oxide is a semiconductor material. Preferred embodiments of this formulation comprise isopropanol and ethanol at the same volume percentages as in the formulation defined just above but lacking the surfactant (0.1-40 vol % isopropanol and 50-99.1 vol % ethanol, and preferred embodiments, as indicated above). Furthermore, the surfactant is present preferably 0.0001 up to 20 vol %, more preferably 0.001-5 vol %.

Suitable surfactants that may be used in the formulations of the invention are for example acetylenic diols or fluoro carbons. Preferably the surfactants have a boiling point (bp) similar to that of the solvent(s) which is (are) used. Examples of such acetylenic diols are those of the Surfynol® series, which are commercially available from Air Products, like for example Surfynol 502® (bp 202° C.), Surfynol 61® (bp 160° C.), Surfynol FS85® (bp 192° C.) or Surfynol PSA216® (bp 140° C.).

Suitable and preferred surfactants are selected from the group consisting of siloxanes, alkanes, amines, alkenes, alkynes, alcohols and/or halogenated derivates of these compounds. Furthermore, fluoro ethers, fluoro esters and/or fluoro ketones can be used. More preferably, these compounds are selected from methyl siloxanes having 6 to 20 carbon atoms, especially 8 to 16 carbon atoms; C7-C14 alkanes, C7-C14 alkenes, C7-C14 alkynes, alcohols having 7 to 14 carbon atoms, fluoroethers having 7 to 14 carbon atoms, fluoroesters having 7 to 14 carbon atoms and fluoroketones having 7 to 14 carbon atoms. Most preferred wetting agents are methylsiloxanes having 8 to 14 carbon atoms.

Useful and preferred alkanes having 7 to 14 carbon atoms include heptane, octane, nonane, decane, undecane, dodecane, tridecane, tetradecane, 3-methylheptane, 4-ethylheptane, 5-propyldecane, trimethyl-cyclohexane and decalin.

Halogenated alkanes having 7 to 14 carbon atoms include 1-chloro-heptane, 1,2-dichlorooctane, tetrafluorooctane, decafluorododecane, perfluorononane, 1,1,1-trifluoromethyldecane, and perfluoromethyldecalin.

Useful and preferred alkenes having 7 to 14 carbon atoms include heptene, octene, nonene, 1-decene, 4-decene, undecene, dodecene, tridecene, tetradecene, 3-methylheptene, 4-ethylheptene, 5-propyldecene, and trimethylcyclohexene.

Halogenated alkenes having 7 to 14 carbon atoms include 1,2-dichloro-octene, tetrafluorooctene, decafluorododecene, perfluorononene, and 1,1,-trifluoromethyldecene.

Useful and preferred alkynes having 7 to 14 carbon atoms include octyne, nonyne, 1-decyne, 4-decyne, dodecyne, tetradecyne, 3-methylheptyne, 4-ethylheptyne, 5-propyldecyne, and trimethylcyclohexyne.

Halogenated alkenes having 7 to 14 carbon atoms include 1,2-dichloro-octyne, tetrafluorooctyne, decafluorododecyne, perfluorononyne, and 1,1,1-trifluoromethyldecyne. Useful and preferred alcohols having 7 to 14 carbon atoms include, heptanol, octanol, nonanol, decanol, undecanol, dodecanol, tridecanol, tetradecanol, 3-methylheptanol, 3,5-dimethyl-1-hexyn-3-ol, 4-ethyl-heptanol, 5-propyldecanol, trimethylcyclohexanol and hydroxyldecalin.

Halogenated alcohols having 7 to 14 carbon atoms include 1-chloro-heptanol, 1,2-dichlorooctanol, tetrafluorooctanol, decafluorododecanol, perfluorononanol, 1,1,1-trifluoromethyldecanol, and 2-trifluoromethyl-1-hydroxydecalin.

Useful and preferred fluoroethers having 7 to 14 carbon atoms include 3-ethoxy-1,1,1,2,3,4,4,5,5,6,6,6 dodecafluoro-2-trifluoromethylhexane, 3-propoxy-1,1,1,2,3,4,4,5,5,6,6,6 dodecafluoro-2-trifluoromethylhexane, and 3-propoxy-1,1,1,2,3,4,4,5,5,5 decafluoro-2-trifluoromethylpentane.

Useful and preferred fluoroesters having 7 to 14 carbon atoms include 3-(1,1,2,3,4,4,5,5,6,6,6 dodecafluoro-2-trifluoromethyl-hexyl) ethanoate, and 3-(1,1,1,2,3,4,4,5,5,5 decafluoro-2-trifluoromethyl-pentyl) propanoate.

Useful and preferred fluoroketones having 7 to 14 carbon atoms include 3-(1,1,1,2,3,4,4,5,5,6,6,6 dodecafluoro-2-trifluoromethyl-hexyl) ethyl-ketone, and 3-(1,1,1,2,3,4,4,5,5,5 decafluoro-2-trifluoromethyl-pentyl) propylketone.

Useful and preferred siloxanes include hexamethyldisiloxane, octamethyl-trisiloxane, decamethyltetrasiloxane, dodecamethylpentasiloxane, and tetradecamethylhexasiloxane.

The concentration of the surfactants is preferably from 0.001 to 4.0% by weight, more preferably 0.01 to 2.0% and most preferably 0.1 to 1.0% by weight relative to the total formulation.

In some embodiments, the invention provides formulations for depositing mesoporous layers, comprising inorganic materials, preferably meal oxide materials, more preferably metal oxide semiconductor and/or insulating materials.

In an embodiment, the formulation comprises constituents for depositing a mesoporous layer comprising a semiconductor material, preferably a metal oxide semiconductor material, most preferably a mesoporous $TiO_2$ layer. In an embodiment, said formulation comprises nanoparticles of the semiconductor material. In an embodiment, said solvent mixture comprises one or more low boiling point solvent and one or more high boiling point solvent. In an embodiment, said high boiling point solvent is a protic and/or non-aromatic solvent, preferably a terpene alcohol, most preferably terpineol. Preferably, said one or more low boiling point solvents are selected from C1-C8 alkyl alcohols. Preferably, said one or more low boiling point solvent provides 10-90 vol %, preferably 20-80 vol %, of the solvent mixture and said one or more high boiling point solvent provides 10-90 vol %, preferably 20-70 vol % of the solvent mixture.

In a preferred embodiment, the formulation for depositing a mesoporous layer comprising a semiconductor material, preferably a mesoporous $TiO_2$ layer, comprises nanoparticles of said semiconductor material, and a carrier composition comprising one or more low boiling point solvents selected from C1-C5 alkyl alcohols, preferably isopropanol, and one or more high boiling point solvents selected from terpene alcohols, preferably terpineol. Preferably, said solvent mixture comprises 15-90 vol. % isopropanol and 85-10 vol. % terpene alcohol, such as terpineol, more preferably 30-85 vol % isopropanol and 15-70 vol % terpene alcohol, preferably terpineol.

In an embodiment, the formulation comprises constituents for depositing a mesoporous layer comprising an insulating material, preferably a metal oxide insulating material, most preferably a mesoporous $ZrO_2$ layer. In an embodiment, said formulation comprises nanoparticles of the insulating material. In an embodiment, said carrier composition comprises a solvent mixture comprises one or more low boiling point solvent and one or more high boiling point solvent. In an embodiment, said high boiling point solvent is a protic and/or non-aromatic solvent, preferably a terpene alcohol, most preferably terpineol. Preferably, said one or more low boiling point solvents are selected from C1-C8 alkyl alcohols. Preferably, said one or more low boiling point solvent provide 40-95 vol %, preferably 60-92 vol %, of the solvent mixture and said one or more high boiling point solvent provides 5-60 vol %, preferably 8-40 vol % of the solvent mixture.

In a preferred embodiment, the formulation for depositing a mesoporous layer comprising an insulating material, preferably a metal oxide insulating material, most preferably a mesoporous $ZrO_2$ layer, comprises nanoparticles of said insulating material, and a carrier composition comprising a solvent mixture comprising a high boiling point solvent selected from terpene alcohols, such as terpineol and one, two or more low boiling point solvents, preferably selected from C1-C5 alkyl alcohols. Preferably, said low boiling point solvents are selected from ethanol and/or isopropanol. Preferably, said solvent mixture comprises 0-60 vol % isopropanol, 0-60 vol % ethanol and 5-50 vol % terpene alcohol, preferably terpineol.

More preferably, said solvent mixture comprises 30-50 vol % isopropanol, 10-50 vol % ethanol and 5-30 vol % terpene alcohol, preferably terpineol.

In an embodiment, the formulation comprises constituents for depositing a mesoporous layer comprising a p-type semiconductor material, preferably a metal oxide semiconductor material, most preferably a mesoporous $NiO_x$ layer, where x is 0.5-2. In an embodiment, said formulation comprises nanoparticles of the p-type semiconductor material. In an embodiment, said carrier composition comprises a solvent mixture comprises one or more low boiling point solvent and one or more high boiling point solvent. In an embodiment, said high boiling point solvent is a protic and/or non-aromatic solvent, preferably a terpene alcohol, most preferably terpineol. Preferably, said one or more low boiling point solvents are selected from C1-C8 alkyl alcohols and xylene (o-, m- or p-xylene, preferably o-m-xylene). Preferably, said C1-C8 alkyl alcohols are selected from ethanol, methanol and propanol, preferably ethanol. Preferably, said one or more low boiling point solvents provide 40-95 vol %, preferably 60-92 vol %, of the solvent mixture and said one or more high boiling point solvent provides 5-60 vol %, preferably 8-40 vol % of the solvent mixture.

In an embodiment, the formulation comprises constituents for depositing a porous layer comprising a carbon material, for example mesoporous and/or micro-porous carbon. In an embodiment, said formulation comprises particles of carbon-black and/or graphite. Preferably said particles are nanoparticles and/or microparticles. In an embodiment, said particles are selected from carbon-black nanoparticles and graphite microparticles, or both. In an embodiment, said solvent mixture comprises one or more low boiling point solvents, preferably two low boiling point solvents, for example two C1-C8 alkyl alcohols. In an embodiment, said solvent mixture comprises one or more C1-C8 alkyl alcohol (alcanol) solvents, preferably two different C1-C8 alkyl alcohol solvents, even more preferably two different C1-C5 alkyl alcohols, most preferably ethanol and isopropanol.

In a preferred embodiment, the formulation for depositing a porous layer comprising a carbon material comprises 10-90 vol % ethanol and 10-90 vol % isopropanol, more preferably 15-85% ethanol and 15-85 vol % isopropanol, most preferably 20-70 vol % ethanol and 30-80 vol % isopropanol.

In a preferred embodiment, formulations comprising nanoparticles and/or carbon micro and/or nanoparticles comprise one or more binders, such as cellulose, for example.

In an embodiment, the method of the invention comprises depositing one or several layers of an electronic device, preferably optoelectronic device by slot-die deposition. In an embodiment, the method comprises depositing, by slot-die deposition, n formulations to provide n layers, wherein n is preferably an integer of 2 to 15, preferably 3 to 10, most preferably 4 to 8.

When two or more layers are deposited, such as a first, second, and up to $n^{th}$ layer, the second and optional subsequent layers are preferably deposited at least partially onto a preceding layer. Generally, said $n^{th}$ layer is at least partially deposited onto the $(n-1)^{th}$ layer so as to at least partially overlap with said $(n-1)^{th}$ layer. For example, the first and second layers may be deposited so as to be substantially superposed or so as to overlap. In an example, one layer extends beyond a border of the other, for example the preceding or subsequent layer.

In a preferred embodiment, two layers "overlap" if 5% or more of the surface of a layer is superposed by a subsequent or preceding layer, meaning that 5% or more of the surface of one of the layers extends on the same area or surface on the substrate as the other layer with which it overlaps. Preferably, two layers "overlap" if 10% or more, 20%, 30%, 50% or more of the surface of a layer is superposed by a subsequent or preceding layer. For example, a layer covering entirely a preceding layer and extending beyond the preceding layer overlaps with the preceding layer, as the surface of the preceding layer is entirely (100%) covered. Preferably, these surfaces are continuous surfaces of a layer.

For the purpose of clarification, it is noted that the term "first" in the expression "first formulation" does not necessarily require that the "first formulation" be deposited before the "second formulation". The first formulation is thus not required to be the preceding layer with respect to the second formulation, for example. The invention encompasses, in some embodiments, that the "second formulation" be deposited timely before the "first formulation, such that the "first formulation" is deposited onto the "second formulation. However, in a preferred embodiment, the "first formulation" is deposited timely before the second, third, etc. formulation.

In an embodiment, the invention comprises depositing several and up to all layers of an electronic device by slot-die deposition. In another embodiment, the invention comprises depositing all layers of an electronic device, except layers requiring organic components for being functional (organic-inorganic layers, dye-layers) by slot-die deposition. In an embodiment, the invention comprises depositing all layers requiring firing and/or sintering by slot-die depositing. In yet another embodiment, formulations for layers requiring organic components for being functional, in particular the organic-inorganic perovskite layer, are also deposited by slot-die deposition.

In an embodiment, the method of the invention comprises depositing, by slot-die deposition, a first formulation as defined in the present specification, and, depositing, by slot-die deposition, a second formulation as defined in the present specification, wherein said first and second formulations are different.

In an embodiment, the method of the invention comprises depositing, by slot-die deposition, a first formulation as defined in the present specification, depositing, by slot-die deposition, a second formulation as defined in the present specification, and, depositing, by slot-die deposition, a third formulation as defined in the present specification, wherein said first, second and third formulations are different.

For the purpose of the present specification the term "different" in the context of a "different layer" and/or a "different formulation", for example refers preferably to a difference with regard to the inorganic constituents, precursors of such inorganic constituents and/or carbon. For example, different formulations may comprise different metal oxides, such as $TiO_2$ and $ZrO_2$. For example, a formulation comprising essentially carbon particles is considered different from a formulation comprising essentially metal oxide nanoparticles as inorganic constituents. The term "different" may also apply to formulations comprising the same inorganic material, but in a different form or different particle sizes or different particle size distributions, resulting in an overall different layer of the final device. For example, two different layers may comprise a compact metal oxide semiconductor layer and a mesoporous layer comprising the same metal oxide material (e.g. compact $TiO_2$ and mesoporous $TiO_2$).

In an embodiment, the method of the invention comprises depositing two or more different formulations, said two or more different formulation comprising different metal oxides, preferably oxides of different metals or different oxides of the same metal. Preferably, said metal oxides are present in the form of nanoparticles in said formulation.

In an embodiment, the method of the invention comprises depositing, by slot-die deposition:

a first formulation, which comprises said metal-organic precursors of said inorganic constituent and preferably is a formulation as defined above for depositing a compact layer comprising an inorganic material, preferably a compact layer comprising a semiconductor material and/or an insulating material and, a second formulation, which comprises said metal oxide nanoparticles and is the formulation for depositing a mesoporous layer, preferably a mesoporous layer comprising a semiconductor material and/or an insulating material, most preferably the formulation as defined above for depositing a mesoporous $TiO_2$ layer.

In an embodiment, the method of the invention comprises depositing, by slot-die deposition:

a first formulation, which comprises nanoparticles of said metal oxide material and preferably is a formulation as defined above for depositing a compact layer comprising a metal oxide material, preferably a compact layer comprising a semiconductor material and/or an insulating material and, a second formulation, which comprises said metal oxide nanoparticles and is the formulation for depositing a mesoporous layer, preferably a mesoporous layer comprising a semiconductor material and/or an insulating material, most preferably the formulation as defined above for depositing a mesoporous $TiO_2$ layer and/or a mesoporous $ZrO_2$ layer.

In an embodiment, the method of the invention comprises depositing, by slot-die deposition:

a first formulation, which comprises said metal-organic precursors of said inorganic constituent and preferably is the formulation as defined above for depositing a compact layer comprising a semiconductor material, in particular the formulation for depositing a compact $TiO_2$ layer, and, a second formulation, which comprises said metal oxide nanoparticles and is the formulation for depositing a mesoporous layer, preferably a mesoporous layer comprising a semiconductor material, most preferably the formulation as defined above for depositing a mesoporous $TiO_2$ layer.

In an embodiment, the method of the invention comprises depositing, by slot-die deposition:

a first formulation comprising nanoparticles comprising a metal oxide semiconductor material and preferably is the formulation as defined above for depositing a mesoporous layer comprising a metal oxide semiconductor material, such as a formulation for depositing a mesoporous $TiO_2$ layer, and, a second formulation comprises nanoparticles comprising a metal oxide insulating material and preferably is the formulation as defined above for depositing a mesoporous layer comprising a metal oxide insulating material, such as the formulation for depositing a mesoporous layer comprising $ZrO_2$.

In an embodiment, the method of the invention comprises depositing, by slot-die deposition:

a first formulation comprising metal oxide nanoparticles, and preferably is selected from the formulation as defined above for depositing a mesoporous layer comprising a metal oxide semiconductor and/or insulating material, for example a mesoporous $TiO_2$ and/or a mesoporous $ZrO_2$ layer, as defined above, a second formulation comprising one or both selected from carbon-black particles and graphite particles and preferably is the formulation as defined above for depositing a porous layer comprising a carbon material.

In an embodiment, the method of the invention comprises depositing, by slot-die deposition:
- a first formulation comprising metal oxide nanoparticles, and preferably is a formulation for depositing a compact layer comprising a semiconductor and/or insulating material,
- a second formulation comprising one or both selected from carbon-black particles and graphite particles and preferably is the formulation as defined above depositing a porous layer comprising a carbon material.

In an embodiment, the method of the invention comprises depositing, by slot-die deposition:
- a first formulation, which comprises said metal-organic precursors of said inorganic constituent and preferably is selected from the formulations as defined above for depositing a compact layer comprising an inorganic material, for example the formulation for depositing a compact $TiO_2$ layer, and,
- a second formulation comprising one or both selected from carbon-black particles and graphite particles and preferably is the formulation as defined above for depositing a porous layer comprising a carbon material.

In an embodiment, the method of the invention comprises depositing, by slot-die deposition: a first formulation for providing a compact layer comprising a metal oxide material; and, a second formulation for providing a mesoporous layer comprising a metal oxide material. Preferably said metal oxides of said compact and mesoporous layers are selected from n-type and p-type semiconductor materials.

In an embodiment, the method of the invention comprises depositing, by slot-die deposition: a first formulation for providing a layer comprising a compact metal oxide material; and, a second formulation for providing a porous layer comprising a carbon material.

In an embodiment, the method of the invention comprises depositing, by slot-die deposition: a first formulation for providing a compact layer comprising a metal oxide semiconductor material; and, a second formulation for providing a mesoporous layer comprising metal oxide semiconductor material.

In an embodiment, the method of the invention comprises depositing, by slot-die deposition: a first formulation for providing a compact layer comprising a metal oxide material; a second formulation for providing a mesoporous layer comprising a semiconductor metal oxide material; and a third formulation for providing a mesoporous layer comprising an insulating material.

In an embodiment, the method of the invention comprises depositing, by slot-die deposition: a first formulation for providing a compact layer comprising a metal oxide material; a second formulation for providing a mesoporous layer comprising a semiconductor metal oxide material; and a third formulation for providing a porous layer comprising carbon.

In an embodiment, the method of the invention comprises depositing, by slot-die deposition: a first formulation for providing a mesoporous layer comprising a n-type semiconductor metal oxide material; and a second formulation for providing a mesoporous layer comprising a p-type semiconductor metal oxide material.

In an embodiment, the method of the invention comprises depositing, by slot-die deposition: a first formulation for providing a mesoporous layer comprising an insulating metal oxide material; and a second formulation for providing a mesoporous layer comprising a p-type semiconductor metal oxide material.

For the purpose of the present specification, a layer comprising a compact metal oxide material encompasses in particular a compact metal oxide layer, including, for example, compact semiconductor layers, such as $cTiO_2$ (where small "c" stands for "compact") or compact insulating layers, such as $cZrO_2$. A mesoporous layer comprising a metal oxide material encompasses in particular a mesoporous metal oxide layer, including, for example mesoporous semiconductor layers, such as $mTiO_2$, (where small "m" stands for "mesoporous" or "nanoporous") and mesoporous insulating layers, such as $mZrO_2$. A porous layer comprising carbon encompasses in particular a porous carbon layer.

The methods of the present invention can be employed for depositing and producing layers of many different types of electronic devices, which are based on different architectures. Accordingly, the invention provides depositing one or more layers by slot-die deposition for producing layers of many different types of solar cells, and also many different types of perovskite solar cells.

A particular novelty of the present invention is the slot-die deposition of one or more formulations comprising nanoparticles, for example for depositing mesoporous layers and/or compact layers of an electronic device. This embodiment applies to the deposition of one or more selected from the group consisting of: compact semiconductor layers, compact insulating layers, mesoporous semiconductor layers, mesoporous layers comprising an insulating material but also porous carbon layers, preferably mesoporous carbon layers, and various combinations of the aforementioned.

A novelty also resides in the deposition, by slot-die deposition, of one or more layers and firing, preferably co-firing of said layers at temperatures of >300° C.

Furthermore, the invention provides, for the first time, slot-die deposition of two or more layers comprising inorganic materials or precursors thereof, such as the depositions of formulations for providing a compact and a mesoporous layer.

Surprisingly, the present invention provides the comparatively rapid deposition of layers of optoelectronic devices by slot-die deposition. This is advantageous and relevant in view of the industrial production of such optoelectronic devices.

In an embodiment, the method of any one of the preceding claims, wherein, during depositing said formulation, a speed of a printer head with respect to a substrate on which said formulation is deposited is 0.2 m/min or higher, preferably 0.5 m/min or higher, most preferably 0.8 m/min or higher. This parameter may be referred to as deposition or coating speed.

In an embodiment, in particular layers comprising inorganic constituents, such as metal oxides, and metal-organic precursors of said inorganic constituents, can be deposited at advantageously high printing or depositions speeds of preferably 0.5 m/min or higher, 0.8 m/min or higher and 1 m/min or higher. The results obtained by the inventors (not shown) indicate that it is possible to deposit such layers at speed of higher than 1 m/min, possibly 2, 3 or more m/minute.

In an embodiment, a flow or pump rate of said formulation when deposited by a printer head is 0.1 ml/min or higher, preferably 0.15 ml/min or higher, and most preferably 0.2 ml/min or higher. The flow or pump rate in combination with the deposition speed mentioned above will determine the thickness of the layer to be obtained. In accordance with the invention, thick layers, such as mesoporous metal oxide layers, could advantageously be deposited with comparatively high flow rates and pump rates.

The formulations of the present disclosure provide various further advantages that render the formulations particular suitable for deposition by slot-die deposition. In particular, the formulations are developed so as to provide homogenous and preferably comparatively thick layers when deposited and allow the homogenous deposition of large areas. The formulations have thus good film forming properties and can be deposited to deposit even layers having a constant thickness. No sedimentation is observed in the formulations before or after deposition, but the constituents remain evenly distributed within the formulation. Furthermore, the formulations have good drying properties. It is observed that during drying (solvent evaporation) some layers my crack such that cracks are formed in the layer during drying. These problems can be avoided with the formulations of the invention. The advantages provided by the present invention are critical for the industrial production of solar cells by deposition methods.

In an embodiment, two different formulations that are successively deposited, such as a first and a second formulation, second and third formulation, third and fourth formulations, are deposited "wet-on-wet", that is, in the absence of an intermediate drying step for removing solvent partially or totally of the already deposited formulation. During the drying step, the deposited formulation is generally exposed to an above-ambient (>25° C.) temperature, e.g. in a particular drying device, such as an oven. During the drying step, 40 vol. % or more and preferably 60 vol. % or more of the one or more solvents is generally removed. In some embodiments, one or more formulations of the invention are deposited "wet-on-wet", with such a drying step being absent.

A device architecture that is particularly envisaged by the present invention is the one of the monolithic perovskite solar cell. Devices according to this architecture comprise a conductive substrate, a compact semiconductor layer, a mesoporous semiconductor layer, a mesoporous layer comprising an insulating material, and a carbon layer. In accordance with the present invention, all these layers may be deposited by slot-die deposition. For providing the organic-inorganic perovskite, one or more solution containing precursors or constituents of the perovskite are deposited onto the carbon after firing, such that said solution infiltrates through the (meso) porous layers. The invention also encompasses, optionally, the deposition of solutions and/or formulations providing the organic-inorganic perovskite by slot-die deposition.

In an embodiment, a p-type semiconductor layer, such as an NiOx layer, is present between the mesoporous layer comprising an insulating material, and a carbon layer.

In an embodiment, the method of the invention comprises co-firing jointly at least a first and a second layer, and preferably up to n layers, wherein after deposition of said first and preferably said $(n-1)^{th}$ layer, no firing is conducted, wherein n is an integer of 2 to 15, preferably 3 to 10, most preferably 4 to 8, and wherein firing and co-firing refer to a temperature treatment of 300° C. or higher.

Preferably, firing after deposition of the first layer and before the deposition of the second and/or $(n-1)^{th}$ layer is absent. The term "co-firing" is used herein to specify that there is only a single firing step wherein the the two and up to n layers are fired together and/or at the same time, and/or to specify that no firing is conducted before the deposition of the second and up to $n^{th}$ layer. "Co-firing" encompasses exposing the two and up to n layers, as applicable, to several firing steps after the deposition of the second and up to $n^{th}$ layer.

For reasons of clarity, it is specified here that two or more co-fired layers are preferably two or more different layers, obtained by the deposition of different formulations. A formulation may be deposited twice or more preferably on the same area on the substrate, in two or more repeated deposition steps, so as to obtain an overall thicker layer. For the purpose of the present specification, the superposed deposition of identical formulations, which are in direct physical contact with each other, is considered to correspond to the deposition of a single layer and/or to a single formulation.

For the purpose of the present specification, the terms "firing", "co-firing" and their grammatical forms are considered to be equivalent to "sintering" and/or "annealing", for example. For the purpose of the present specification, the aforementioned terms refer to a temperature treatment where the layers are exposed to temperatures of 300° C. or more.

In a preferred embodiment, firing, co-firing, sintering and/or annealing is conducted at a temperature of ≥300° C., preferably ≥350° C., more preferably ≥400° C., and most preferably ≥450° C.

In a more preferred embodiment, firing, co-firing is conducted at a temperature of ≥350° C., preferably ≥400° C.

In an embodiment, co-firing is conducted at a temperature of <550° C., preferably ≤520° C., more preferably ≤500° C., and most preferably ≤480° C.

In a preferred embodiment, co-firing is conducted at a temperature of 300-550° C., preferably 300-520° C., more preferably 350-500° C., more preferably 350-480° C., and most preferably 400-480° C.

Co-firing temperatures below 500° C. are in particular preferred in embodiments where films comprising carbon particles for producing a porous carbon layer are also present and co-fired together with one or more films comprising metal oxides or precursors thereof. The present inventors observed that co-firing stacks comprising metal oxide and carbon layers, due to cracking of the carbon layer.

The firing of layers comprising inorganic materials, in particular metal oxide materials, generally results in a functional or final layer capable of fulfilling its function in the operating electronic device. During firing, organic materials, such as residual solvents, binders and/or other organic residues are removed. Therefore, firing and co-firing is preferably conducted before the deposition of layers requiring organic matter for being functional. Accordingly, firing and co-firing is preferably conducted before the deposition of an organic-inorganic perovskite and/or of a sensitizer comprising organic components, such as a dye, for example.

The co-firing of several layers allows the significant reduction of the manufacturing costs and time. In the art, separate firing steps have always been conducted after deposition of a particular inorganic layer. The firing of layer based on inorganic materials before the deposition of a subsequent layer was considered to be required due to the shrinkage of the layer experienced during firing. The shrinkage is partially expected to be due to the removal of organic components. Therefore, the fact that functional devices can be obtained by a single co-firing step is highly surprising.

While co-firing is preferred, the present invention encompasses the firing after deposition of a particular (single) layer in accordance with the invention. A layer comprising inorganic materials and/or carbon deposited in accordance with the invention may be fired after the deposition of said layer and/or before the deposition of a subsequent layer, wherein said subsequent layer may also be fired separately.

For the purpose of the present specification, "drying" should be distinguished from "firing". The present invention does preferably not exclude drying before the deposition of a subsequent layer. Drying steps have the general purpose of removing at least some of the solvents present in the respective formulation. Unlike "firing", "drying" does frequently not entirely remove all organic material that was present in the layer. "Drying" is generally conducted at temperatures below 300° C.

In a preferred embodiment, the methods comprise drying said first, second, and, if applicable, third, fourth, and/or $(n-1)^{th}$ after deposition and before deposition of a subsequent layer, wherein drying is preferably conducted at a temperature of <300° C., more preferably <250° C., most preferably ≤200° C. Drying may also be conducted after deposition of said $n^{th}$ layer and/or before co-firing or firing said n layers. Drying may also be conducted before firing of any particular layer, in particular also in the absence of co-firing.

As detailed elsewhere in this specification, the present invention encompasses co-firing of a plurality of layers in a single firing step. Interestingly, this surprising characteristic makes it possible to scribe, in particular co-scribe, a plurality of deposited but yet unfired layers, wherein said layers are preferably layers requiring firing for yielding a functional layer.

In an embodiment, the method of the invention comprises co-scribing, preferably by laser scribing, separating and/or insulating lines on a plurality of layers deposited in accordance with the invention, preferably deposited by slot-die deposition.

When depositing layers of an electronic device, the layers are frequently deposited as continuous stripes or sheets, which cover or encompass a plurality of individual or separate devices and layers. At some stage in the manufacturing process, the individual cells or layers need to be separated, at least electrically, from certain neighbouring cells deposited on the same substrate, and/or from superposed and/or overlapping layers.

Separation and/or insulating lines may be drawn so as to electrically separate certain cells and/or layers and/or in order to achieve a desirable order of the electrical connection between cells, for example in order to connect cells having a defined surface in series and/or in parallel, so as to provide a target electrical power output in terms of voltage and current.

Insulating lines may be drawn mechanically, for example manually. In a preferred embodiment, insulating lines are made by laser-scribing. In laser-scribing, a laser beam is targeted to the deposited but preferably yet un-fired layers and is made to move relative to the substrate along a determined line in order to remove the deposited materials at the location where the laser hits the layers.

Laser scribing is generally no longer possible after the layers providing inorganic materials have been sintered, as the deposited material becomes resistant to laser-scribing or would require more powerful lasers. Therefore, the co-scribing of a plurality of layers after deposition and before firing of said layers is an advantageous embodiment of the invention, as it is suitable to reduce the number of steps involved in manufacturing the device. As with "co-firing", "co-scribing" preferably applies to layers requiring firing for being operational in the final device.

In an embodiment, the method of the invention provides depositing a formulation for providing a layer comprising an active, preferably a photoactive material, for example a sensitizer. Preferably, the sensitizer is a dye or a perovskite, preferably an organic-inorganic perovskite.

In an embodiment, the method of the invention comprises depositing one or more formulation for providing an organic-inorganic perovskite, wherein said formulation is deposited by slot-die deposition or by another deposition technique.

If the sensitizer requires organic components for functioning, which is the case for dyes and organic-inorganic perovskites, the formulation comprising the sensitizer or a precursor thereof is preferably deposited after firing and/or co-firing inorganic materials and/or layers. Further details about firing inorganic materials are provided elsewhere in this specification.

In a preferred embodiment, the optoelectronic device comprises a perovskite layer, preferably an organic-inorganic perovskite layer. Formulations for depositing perovskite layers may comprise several or all constituents of the perovskite layer to be produced. Perovskite layers may be deposited in a single-step deposition process, in which a formulation comprising all constituents of the perovskite is deposited. Alternatively, perovskites may be deposited by separate deposition of formulations comprising part of the constituents of the perovskite to be produced. For example, a formulation comprising the metal cation and one or more anions of the perovskite may be deposited first, followed by the deposition of a formulation comprising an organic cation and one or more anions, for example. Perovskite materials suitable for optoelectronic devices, in particular perovskite solar cells, have been previously reported. For the purpose of providing well-known example, $CH_3NH_3PbI_3$ is cited. Mixed anion and mixed cation perovskites have been reported and may be used for the purpose of the present specification.

The following examples are provided to illustrate various embodiments of the present invention. The examples are not intended to limit the invention in any way.

EXAMPLES

Example 1: Preparation of Ink Formulations for Slot-Die Coating a Perovskite Solar Cell 1.1 Ink Formulation 1 for Slot-Die Coating of a Compact $TiO_2$ layer ($cTiO_2$)

Organic titanate (titanium diisopropoxide bis(acetylacetonate)), CAS Number 17927-72-9 was obtained from Sigma Aldrich (Merck).

1 vol-% of the organic titanate was mixed with the following constituents at the indicated volume percentages:
10 vol. of tetralin (boiling point 208° C.),
7 vol. of isopropanol (boiling point 82° C.),
3 vol. of absolute ethanol (boiling point 78.24° C.),
0.002 vol. of Zonyl FS-300 fluorosurfactant (40 wt % in H2O, as supplied).

The resulting mixture can be seen as a 1:20 volume dilution of the organic titanate in the mixture of the remaining solvents and surfactant.

1.2 Ink Formulation 2 for Slot-Die Coating a Mesoporous $TiO_2$ Layer ($mTiO_2$)

1 vol. of the commercial titania paste (Ti-Nanoxide T/SP) obtained from Solaronix SA, rue de l'Ouriette 129, 1170 Aubonne, Switzerland (www.solaronix.com) was mixed with the following constituents:
10 vol. of isopropanol,
2 vol. of terpineol (boiling point 214-217° C.).

1.3 Ink Formulation 3 for Slot-Die Coating a Mesoporous Zirconia (mZrO$_2$) Layer 4 vol. of the zirconia paste Zr-Nanoxide ZT/SP obtained from Solaronix SA, was mixed with the following constituents:
- 1 vol. of terpineol,
- 9 vol. of isopropanol.
- 2 vol. of ethanol.

1.4 Ink Formulation 4 for Slot-Die Coating a Porous Carbon Layer 10 vol. of the original carbon non-diluted carbon paste Elcocarb B/SP was obtained from Solaronix and mixed with the following constituents as indicated:
- 2 vol. of isopropanol
- 8 vol. of ethanol.

1.5 Ink Formulation 5 for Slot-Die Coating a Mesoporous NiOx Layer 2 vol. of NiOx (x being in the range of 0.5-2) Screen Printed paste (Ni-Nanoxide N/SP) was obtained from Solaronix and mixed with the following constituents as indicated:
- 2 vol. of terpineol
- 5 vol. o-m-xylene (a mixture of o- and m xylene) (boiling point 138-144° C.)
- 5 vol. of ethanol.

The inks prepared as described were stored at room temperature (25° C.) until further use with magnetic steering.

Figure 2:
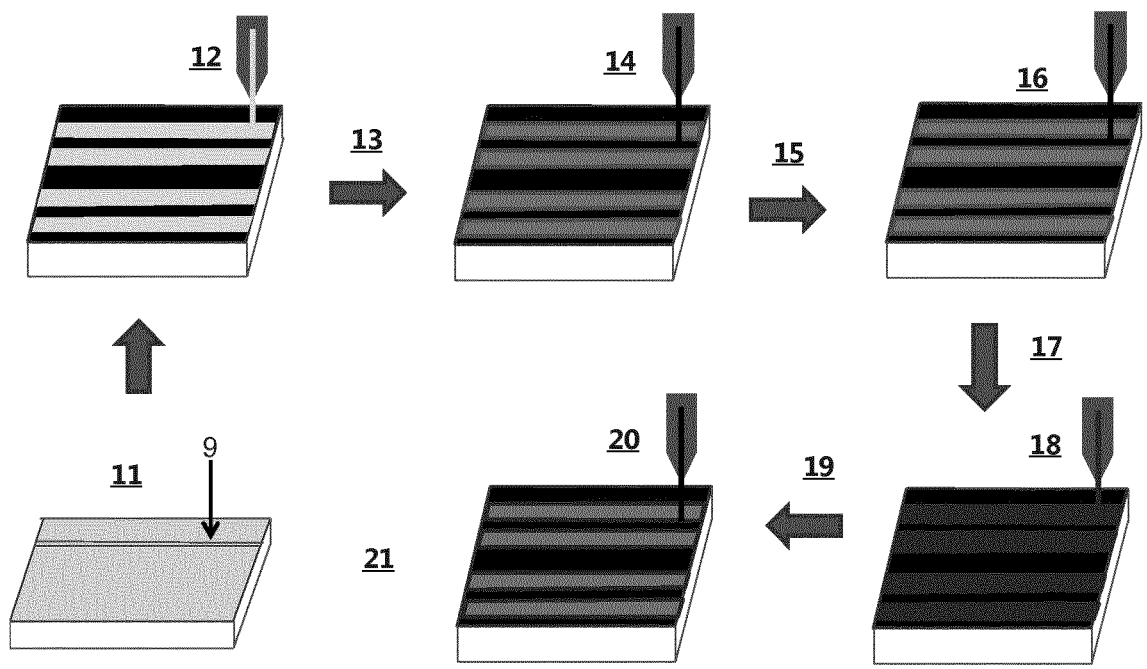
FIG. 2 schematically illustrates a sequence of method steps for producing solar cells in accordance with an embodiment of the invention.

Example 2: Deposition of Layers by Slot-Die Coating and Firing to Obtained Layers The overall sequence of the deposition of layers is indicated in FIG. 2. For the slot-die coating, a slot-die printer was obtained from TSE Troller AG, Murgenthal, Switzerland.

Figure 3:
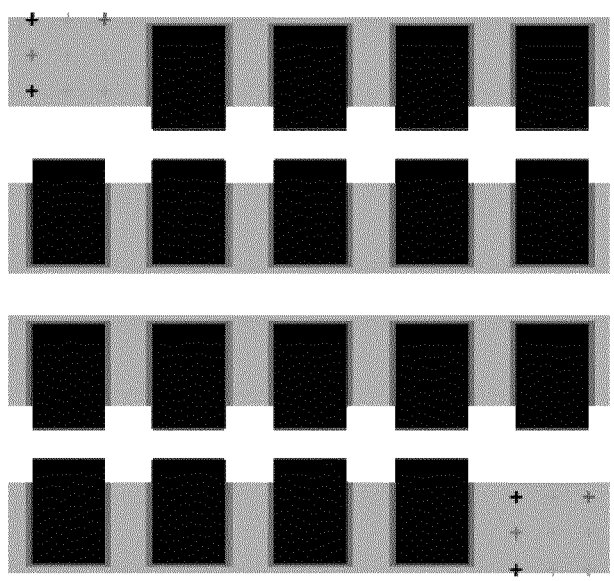
FIG. 3 is a schematic representation of the pattern of solar cells deposited on a 10 cm×10 cm FTO glass substrate in accordance with an embodiment of the invention.

First, (FIG. 2, ref. 11) an FTO glass substrate (10 cm×10 cm) was subjected to laser ablation so at to create insulating lines 9 for electrically separating 4 stripes and preparing the deposition of overall 18 solar cells according to the pattern shown in FIG. 3.

The laser-scribed FTO substrates were cleaned by plasma cleaning.

2.1 Slot-Die Coating a Layer for a Compact TiO$_2$ Layer

At ref. 12 in FIG. 2, four (4) stripes of 14 mm width were deposited by slot-die coating ink formulation 1 using the following parameters: speed of printer head: 1 m/min, flow rate: 0.2 ml/min, 50 micron internal shim foil.

The coating process was repeated so as two have two stripe-shaped layers deposited one on top the other "wet on wet" (without intermediate drying). Thereafter, the layers were dried at 70° C. for 10 min, followed by drying at 200° C. for 1 hr (FIG. 2, ref. 13). These layers will yield, in the final device (after firing) a compact TiO$_2$ layer of <40 nm.

2.2 Slot-Die Coating a Layer for a Mesoporous TiO$_2$ Layer

At ref. 14 in FIG. 2, ink formulation 2 was deposited with the slot-die printer in order to obtain a layer using the following parameters: speed: 1 m/min; flow rate of 0.8 ml/min; 14 mm stripe width; 50 micron internal shim foil.

The coating process was repeated so as to obtain two stripes deposited one on top the other "wet on wet" (without intermediate drying). Thereafter, the stripes were dried at 110° C. for 10 minutes (FIG. 2, ref. 15). These layers will yield, in the final device, a mesoporous TiO$_2$ layer of about 600 nm thickness.

2.3 Slot-Die Coating a Layer for a Mesoporous ZrO$_2$ Layer

At ref. 16 in FIG. 2, ink formulation 3 was deposited with the slot-die printer using the following parameters: speed: 0.9 m/min, flow rate: 1.25 ml/min, 14 mm stripe width, 100 micron internal shim foil.

The coating process was repeated so as to obtain two stripe-shaped layers deposited one on top the other "wet on wet" (without intermediate drying). Thereafter, the stripes were dried at 110° C. for 10 minutes (FIG. 2, ref 17). These layers will form, after firing, a mesoporous ZrO$_2$ layer of about 1600 nm thickness.

2.3a Slot-Die Coating a Mesoporous NiOx Layer

In an optional process step, a hole transport and/or p-type semiconductor layer (ink formulation 5) was deposited onto the mZrO$_2$ layer with the slot-die printer using the following parameters: speed: 1.0 m/min, flow rate: 1.0 ml/min. The coating process was repeated so as two obtain two stripes deposited one on top the other "wet on wet" (without intermediate drying). Thereafter, the stripes were dried at 110° C. for 10 minutes. These layers will form, after firing, a mesoporous NiOx layer of about 600 nm thickness.

2.4 Slot-Die Coating a Porous Carbon Layer

At ref 18 in FIG. 2, ink formulation 4 was deposited with the slot-die printer in order to obtain a porous carbon layer using the following parameters: speed: 0.2 m/min, flow rate: 0.2 ml/min, 15 mm stripe width, 100 micron internal shim foil. The coating process was repeated so as to obtain two stripes deposited one on top the other "wet on wet" (without intermediate drying). Thereafter, the stripes were dried at 110° C. for 10 minutes (not shown in FIG. 2). These layers will form, after firing, a porous carbon layer of 10-12 micron thickness.

2.5 Single Co-Firing of Metal Oxide and Carbon Layer

At ref. 19 in FIG. 2, The layers deposited as described in points 2.1-2.4, including devices comprising the optional NiOx formulation of point 2.3a, were then co-fired at 450° C. for 1 hour, in order to remove organic residues.

Example 3: Preparation of a Perovskite Solar Cell

Example 3.1 Perovskite Deposition by Manual Pipetting

At ref. 20 in FIG. 2, perovskite solar cells were finalized by infiltration of MAPbI$_3$ (methyl ammonium lead iodide ink) on top of the carbon layers using pipetting, and the substrates were subjected to annealing at 50° C. for 1 hr (ref 21) in a hot oven, to yield the functional devices.

Example 3.2 Perovskite Deposition by Slot Dye Coating

Perovskite ink solution was deposited by slot-die printing on to the fired precursor cells obtained after step 2.5 above.

The perovskite deposition was conducted as described in K. Hwang et al *Adv. Mater.* 27(7), 2015, "Toward Large Scale Roll-to-Roll Production of Fully Printed Perovskite Solar Cells".

FIG. 1A shows the architecture of solar cells 1 produced in accordance with Examples 1-3, where 2 represents the transparent conductive substrate comprising glass 3 and an FTO 4. The cTiO$_2$ layer 5 is deposited on the FTO, followed by mesoporous TiO$_2$ 6, mesoporous ZrO$_2$ 7 and carbon 8. The cells connected in series by interconnecting scribes 9 made in the FTO layer and scribes 10 made by laser-scribing before firing. FIG. 1B is a device as shown in FIG. 1A, further comprising a metal oxide p-type semiconductor layer 22 on top of the mZrO$_2$ layer. Furthermore, an overall sealing 3' is shown, which may be a resin or plastic foil, for covering and protecting the device after fabrication.

FIG. 3 shows a top-down view on 18 perovskite solar cells on the 10 cm×10 cm FTO glass substrate produced as described in Example 2.

Example 4: Photovoltaic Parameters

The cells produced according to Examples 1-2 and 3.1 were tested under AM 1.5 simulated sunlight, 1000 W/m2. Voltage-current scan was conducted as follows: 1 V to −0.3 V, 5 mV increments, 1.2 s between each increment.

Figure 4:
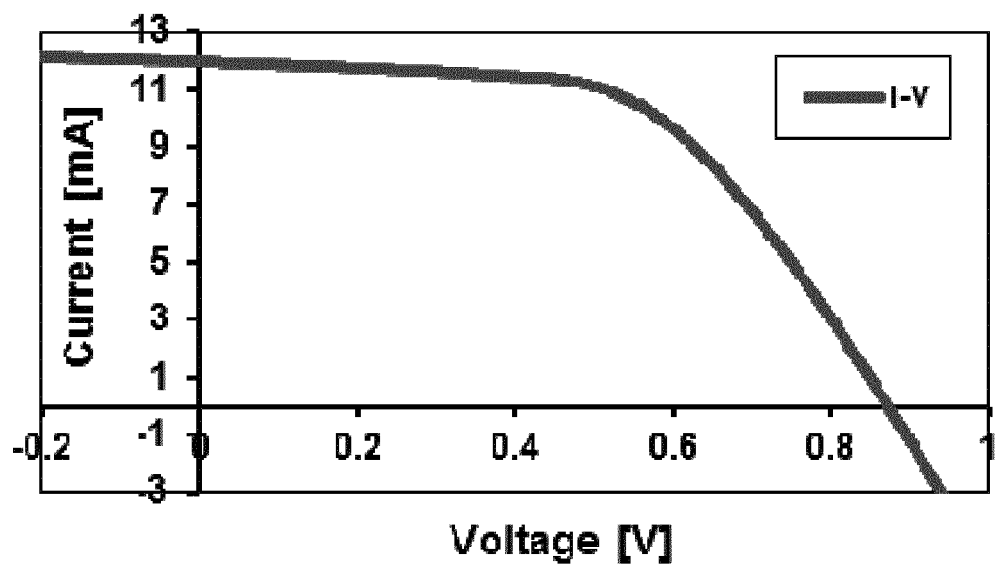
FIG. 4 is a graph showing the current-voltage (I-V) curve of an exemplary solar cell produced according to an embodiment of the invention.

The results are shown in FIG. 4. In average, perovskite solar cells exhibited a short circuit current ($J_{SC}$) of 18.75 mA/cm$^2$, an open current voltage ($V_{OC}$) of 0.89 V, a fill factor of 66.7 and a power conversion efficiency of 11.22% when measured at 1000 W/m$^2$ artificial sunlight. FIG. 4 shows the current-voltage (I-V) curve of a typical, fully slot-die coated perovskite solar cell.

Example 5: Further Characterization of Layer Structure

Besides device efficiency, we also consolidated layer formation, layer structure and interfacial properties by surface scanning and X-ray scattering techniques. The AFM images show the morphology obtained using different coating methods for each of the layers. The images were compared with images taken from layers deposited by spray pyrolysis. Generally, the layers obtained by slot-dye-coating exhibited reduced roughness but they follow the same roughness profile compared to the layers deposited by spray-pyrolysis.

The XRD spectra of the compact $TiO_2$ obtained by three different coating methods were prepared (slot-die coating, spray pyrolysis and screen printing). Also, the XRD of other slot die coated layers were compared with screen printed layers. The spectra of the various layers show the same main peaks, indicating comparable crystallinity.

Finally, perovskite formation in the complete MPSC (Monolithic Perovskite Solar Cell) stack was followed by XRD. The obtained results match the literature, thus confirming crystallization behaviour similar to the reported values and full conversion of precursor ink into perovskite. In particular, all the perovskite peaks are present.

Several publications and patent documents are cited in the foregoing specification in order to more fully describe the state of the art to which this invention pertains. The disclosure of each of these citations is incorporated by reference herein.

While certain of the preferred embodiments of the present invention have been described and specifically exemplified above, it is not intended that the invention be limited to such embodiments. Various modifications may be made thereto without departing from the scope and spirit of the present invention, as set forth in the following claims.

The invention claimed is:

1. A method for depositing one or more layers of an optoelectronic device, the method comprising:
   depositing one or more formulation by slot-die deposition, wherein said one or more formulation comprises:
   one or more selected from the group consisting of: nanoparticles of a metal oxide material, metal-organic precursors of said metal oxide material, and carbon; and,
   a carrier composition comprising a solvent mixture comprising one or more low boiling point solvent and one or more high boiling point solvent, wherein said one or more low boiling point solvent has a boiling point of <200° C. and said one or more high boiling point solvent has a boiling point of ≥200° ° C.

2. The method of claim 1, wherein said one or more low boiling point solvent is selected from C1-C5 alkyl alcohols (alcanols) and wherein said one or more high boiling point solvent is selected from the group consisting of: aromatic solvents, non-aromatic solvents, protic solvents, aprotic solvents, aprotic and aromatic solvents.

3. The method of claim 1, wherein said one or more formulation further comprises a surfactant-selected from fluorosurfactants, siloxanes, amine, and alkane surfactants.

4. The method of claim 1, wherein said solvent mixture comprises two different C1-C8 alkyl alcohol solvents and/or wherein said one or more high boiling point solvent comprises an aprotic and/or aromatic solvent.

5. The method of claim 1, wherein said one or more high boiling point solvent comprises a protic and/or non-aromatic solvent.

6. The method of claim 1, wherein said one or more formulation comprises one or both selected from carbon-black particles and graphite particles.

7. The method of claim 6, wherein said solvent mixture comprises one or more C1-C8 alkyl alcohol solvents.

8. The method of claim 1, wherein during depositing said one or more formulation a speed of a printer head with respect to a substrate on which said one or more formulation is deposited is 0.2 m/min or higher.

9. The method of claim 1, comprising:
   depositing, by slot-die deposition, a first formulation, and, depositing, by slot-die deposition, a second formulation, wherein said first and second formulations comprise:
      one or more selected from the group consisting of: inorganic constituents, metal-organic precursors of said inorganic constituents, and carbon; and,
      a carrier composition comprising one or more solvents, wherein said first and second formulations are different.

10. The method of claim 9, wherein:
   said first formulation comprises said metal-organic precursors of said inorganic constituent, and,
   said second formulation comprises metal oxide nanoparticles.

11. The method of claim 9, wherein:
   said first formulation comprises, and
   said second formulation comprises nanoparticles comprising a metal oxide insulating material or one or both selected from carbon-black particles and graphite particles.

12. The method of claim 1, comprising depositing, by slot-die deposition n formulations to provide n layers, wherein n is an integer of 2 to 15.

13. The method of claim 1, comprising depositing, by slot-die deposition, a plurality of formulations for providing:
   a compact layer comprising a metal oxide semiconductor material,
   a mesoporous layer comprising a metal oxide semiconductor material,
   a mesoporous layer comprising a metal oxide insulating material, and, optionally,
   a porous layer comprising one or more carbon materials.

14. A method for providing two or more layers of an optoelectronic device, the method comprising:
   depositing a first formulation for obtaining a first layer of said optoelectronic device, wherein depositing said first formulation comprises depositing, by slot-die deposition, said first formulation, and depositing a second formulation for obtaining a second layer of said optoelectronic device, wherein said second layer is a mesoporous insulating layer, and wherein depositing said second formulation comprises depositing, by slot-die deposition, a second formulation, wherein said first formulation comprises nanoparticles comprising a metal oxide semiconductor material, and, said second formulation comprises nanoparticles comprising a metal oxide insulating material, wherein said first and second formulations are different, and wherein said first and second formulations further comprise a carrier composition comprising one or more solvents, and wherein said second formulation is deposited on said first formulation in the absence of an intermediate drying step for removing 40% or more of the solvent of the already deposited first formulation.

15. A method for providing two or more layers of an optoelectronic device, the method comprising:

depositing, by slot-die deposition, a first formulation for obtaining a first layer of said optoelectronic device, and, depositing, by slot-die deposition, a second formulation for obtaining a second layer of said optoelectronic device, wherein said first formulation comprises metal oxide nanoparticles, and wherein said metal oxide is selected from the group consisting of: NiOx, with x being between 0.5 and 2, $SiO_2$, $TiO_2$, $Al_2O_3$, $ZrO_2$, $HfO_2$, $SnO_2$, $Fe_2O_3$, ZnO, $WO_3$, $Nb_2O_5$, $In_2O_3$, $Bi_2O_3$, $Y_2O_3$, $Pr_2O_3$, $CeO_2$, and other rare earth metal oxides, $MgTiO_3$, $SrTiO_3$, $BaTiO_3$, $Al_2TiO_5$, $Bi_4Ti_3O_{12}$ and other titanates, $CaSnO_3$, $SrSnO_3$, $BaSnO_3$, $Bi_2Sn_3O_9$, $Zn_2SnO_4$, $ZnSnO_3$ and other stannates, $CaZrO_3$, $SrZrO_3$, $BaZrO_3$, $Bi_4Zr_3O_{12}$ and other zirconates, combinations of two or more of the aforementioned and other multi-element oxides containing at least two of alkaline earth metal elements, Al, Ga, In, Si, Ge, Sn, Pb, Sb, Bi, Sc, Y, La or any other lanthanide, Ti, Zr, Hf, Nb, Ta, Mo, W, Cu, or $Fe_2O_3$, and combinations thereof, and, said second formulation comprises one or both selected from carbon-black particles and graphite particles, wherein said first and second formulations are different, and wherein said first and second formulations further comprise a carrier composition comprising one or more solvents, and wherein said second layer is provided on the top of the first layer in said optoelectronic device.

16. A method for providing a plurality of layers of an optoelectronic device, the method comprising:

depositing, by slot-die deposition, a plurality of formulations, for providing said layers of said optoelectronic device, wherein said plurality of formulations comprise:

a formulation for providing compact layer comprising a metal oxide semiconductor material, a formulation for providing mesoporous layer comprising a metal oxide semiconductor material, a formulation for providing mesoporous layer comprising a metal oxide insulating material, and a formulation for providing porous layer comprising one or more carbon materials, wherein each of said formulations comprises:

one or more selected from the group consisting of: inorganic constituents of a metal oxide material, metal-organic precursors of said inorganic constituents, and carbon; and, a carrier composition comprising one or more solvents.

* * * * *